United States Patent
Amano et al.

[11] Patent Number: 5,355,385
[45] Date of Patent: Oct. 11, 1994

[54] LASER DIODE DEVICE HAVING A PROTECTIVE LAYER ON ITS LIGHT-EMITTING END FACE

[75] Inventors: Akira Amano; Yoichi Shindo; Nobutaka Suganuma; Katsue Nakata, all of Kanagawa, Japan

[73] Assignee: Fuji Electric Co., Ltd., Kanagawa, Japan

[21] Appl. No.: 788,601

[22] Filed: Nov. 6, 1991

[30] Foreign Application Priority Data

Nov. 7, 1990 [JP] Japan .................. 2-302258

[51] Int. Cl.⁵ .................................................. H01S 3/19
[52] U.S. Cl. ................................................... 372/49
[58] Field of Search ................................. 372/49, 43, 44

[56] References Cited

U.S. PATENT DOCUMENTS

| | | | |
|---|---|---|---|
| 4,852,112 | 7/1989 | Kagawa et al. | 372/49 |
| 4,951,291 | 8/1990 | Miyauchi et al. | 372/49 |
| 4,951,292 | 8/1990 | Kuindersma et al. | 372/49 |
| 4,962,985 | 10/1990 | LeGrange | 372/49 |
| 4,975,922 | 12/1990 | Sakane et al. | 372/49 |
| 4,985,370 | 1/1991 | Ponjee et al. | 437/129 |

*Primary Examiner*—James W. Davie
*Attorney, Agent, or Firm*—Finnegan, Henderson, Farabow, Garrett & Dunner

[57] ABSTRACT

A laser diode in which a laser diode chip having a light-emitting end face is resin-encapsulated by means of an encapsulating resin layer constituted by an epoxy-based resin or the like. An end-face-breakage preventing layer formed of a silicon-based resin having a high coefficient of light absorption in the wavelength band of a laser beam and a high bond energy is formed on the light-emitting end face. The end-face-breakage preventing layer 10 has a thickness of approximately 20 to 30 μm.

15 Claims, 4 Drawing Sheets

LASER DIODE DEVICE HAVING A PROTECTIVE LAYER ON ITS LIGHT-EMITTING END FACE

BACKGROUND OF THE INVENTION

1. Field of the Invention

The present invention relates to a laser diode formed by encapsulating a laser diode chip in a resin and, more particularly, to a technique for preventing the breakage of the resin on a light-emitting end face of the laser diode chip due to the emission of a laser beam.

2. Description of the Related Art

As shown in FIG. 6, a known laser diode chip is arranged such that an n-type clad layer 113 formed of aluminum-gallium-arsenide (AlGaAs), an active layer 114 formed of gallium-arsenide (GaAs), a p-type clad layer 115, and a p-type cap layer 116 are laminated on an n-type GaAs substrate 112. An electrode 117 is selectively formed on the obverse surface of the laser diode chip in an opening of the p-type cap layer 116, while a rear electrode 8 is formed on the reverse surface of the GaAs substrate 112, so as to form a laser diode chip 111 of a double heterostructure (DH structure). In addition, as shown in FIG. 7, this laser diode chip 111 is mounted on a radiation plate 23a, and the assembly is encapsulated with an encapsulating resin layer 9 formed of a transparent epoxy resin or the like. In FIG. 7, reference numeral 20a denotes a lead frame; numeral 21 denotes a gold wire used for the wiring of each electrode; and numeral 22 denotes a photodiode.

In the above-described conventional laser diode, problems arise because the epoxy resin directly abuts against a light-emitting end face 33, through which a laser beam is emitted from a light-emitting area 35 of the laser diode chip 111. If the laser diode is continuously oscillated, the encapsulating resin layer 9 in the vicinity of the light-emitting end face 33 is decomposed by the heat generated at this face. Since the decomposition of the resin layer 9 lowers the light emission efficiency of the laser diode, the amount of generated heat increases, causing promotion of the decomposition. In some cases, the promoted decomposition results in the formation of a cavity in the encapsulating resin layer 9 in the vicinity of the light-emitting end face 33.

For example, in a case where a laser diode with an output of 5 mW and an oscillation wavelength of 780 nm is continuously oscillated in a state close to its maximum rating, a conical broken area having a bottom diameter of 5 $\mu$m and a height of 5 $\mu$m is formed in the encapsulating resin layer 9 in the vicinity of the light-emitting end face 33 after a lapse of approximately 1000 hours.

Additionally, where a laser diode with a maximum rating of 5 mW is used as a pickup for an optical recording medium, and is continuously operated at an operating current of about 55 mA and at an ambient temperature of approximately 60° C., the encapsulating resin layer 9 in the vicinity of the light-emitting end face 33 melts and breaks. As a result, a cavity is formed after approximately 40 to 60 hours of use by the optical energy of the laser beam, and the light waves of the laser beam are disturbed.

SUMMARY OF THE INVENTION

The present invention has been made in view of the above circumstances and has an object to provide a highly reliable laser diode in which an encapsulating resin is protected by forming a heat-resistant layer having a low laser-beam absorbance on the light-emitting end face of the laser diode, thereby overcoming the above-described problems of the conventional art.

Additional objects and advantages of the invention will be set forth in part in the description which follows, and in part will be obvious from the description, or may be learned by practice of the invention. The objects and advantages of the invention will be realized and attained by means of the elements and the combinations particularly pointed out in the appended claims.

To achieve the objects and in accordance with the purpose of the invention, as embodied and broadly described herein, the invention comprises a laser diode chip encapsulated with a resin, the laser diode chip having at least one light-emitting end face and including an end-face-breakage preventing layer disposed on the light-emitting end face. The end-face-breakage preventing layer has a thickness of at least 5 $\mu$m and is made of an organic resin having a low coefficient of light absorption in a wavelength region of the laser diode, and having a dissociation energy of at least 90 kcal/mol.

The dissociation energy is the energy required to decompose atoms, constituting a basic framework and the like of the organic resin, from a bonded state to a dissociated state, and corresponds to the bond energy of the atoms of a polymer. It is possible to use, as the end-face-breakage preventing layer, a silicon-based resin having dimethylpolysiloxane ($\{(CH_3)_2\text{-Si-O}\}_n$) as a principal component, or an acrylic resin such as polymethyl methacrylate resin.

Instead of an organic resin material, it is possible to use an end-face-breakage preventing layer made of an inorganic resin having a thickness of at least 5 $\mu$m and a low coefficient of light absorption in a wavelength region of the laser diode. In this case, it is possible to use, as a principle component of the end-face-breakage preventing layer, an aluminum oxide, a silicon oxide, or a low-melting glass.

In the present invention, the thickness of the end-face-breakage preventing layer is preferably set in the range of approximately 20 to 30 $\mu$m so as to control the density of the laser beam passing through the encapsulating resin layer, thereby further enhancing the effect of protection of the encapsulating resin layer.

Since the end-face-breakage preventing layer, having a low coefficient of absorption with respect to the laser beam, is formed on the light-emitting end face, the amount of heat generated due to the absorption of the laser beam at a boundary portion is small. In addition, even if heat is conducted from the light-emitting end face due to the generation of heat in the laser diode chip, since the end-face-breakage preventing layer is formed of a highly heat-resistant material, breakage such as decomposition does not occur. Accordingly, since the end-face-breakage preventing layer, having properties that are unlikely to undergo change, is formed at the portion where breakage is most likely to occur, decomposition and the like do not practically occur in the resin in the vicinity of the light-emitting end face of the laser diode chip. Thus, it is possible to enhance the reliability and service life of the laser diode through stabilization of the light emission characteristics of the laser diode.

Additionally, in the case where the thickness of the end-face-breakage preventing layer is set in the range of approximately 20 to 30 $\mu$m, as the laser beam passes through the end-face-breakage preventing layer, the beam area of the laser beam is expanded in the interior of the end-face-breakage preventing layer, and the laser beam passes through the encapsulating resin layer in this state. Since the laser beam passes through the encapsulating resin layer in an expanded state in which its energy density is small, damage to the encapsulating resin layer is less likely to occur.

It is to be understood that both the foregoing general description and the following detailed description are exemplary and explanatory only and are not restrictive of the invention, as claimed. The above and other objects, features, and advantages of the present invention will become more apparent from the following description of the embodiments of the invention.

BRIEF DESCRIPTION OF THE DRAWINGS

The accompanying drawings, which are incorporated in and constitute a part of this specification, illustrate embodiments of the invention and, together with the description, serve to explain the objects, advantages, and principles of the invention. In the drawings.

DESCRIPTION OF THE PREFERRED EMBODIMENTS

Reference will now be made in detail to the present preferred embodiments of the invention, examples of which are illustrated in the accompanying drawings. Wherever possible, the same reference numbers will be used throughout the drawings to refer to the same or like parts.

FIRST EMBODIMENT

Figure 1:
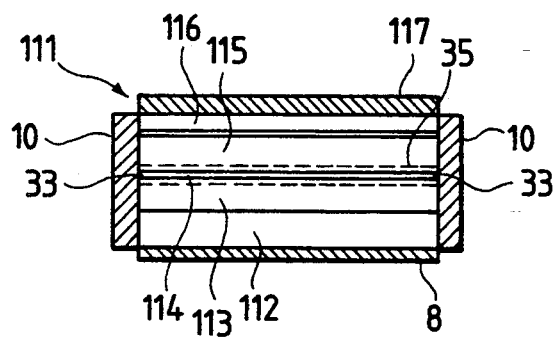
FIG. 1 is a cross-sectional view of a laser diode chip used in a laser diode in accordance with a first embodiment of the invention.

FIG. 1 is a cross-sectional view of a laser diode chip 111 used in a laser diode in accordance with a first embodiment of the present invention. As embodied herein, an end-face-breakage preventing layer 10, constituted by a heat-resistant organic resin layer having a thickness of approximately 5 μm or more, is coated on a light-emitting end face 33 of the laser diode chip 111. The organic resin layer has a low coefficient of light absorption in the wavelength band of a laser beam and a dissociation energy of approximately 90 kcal/mol or more. The dissociation energy is the energy required to decompose atoms, constituting a basic framework and the like of the organic resin, from a bonded state to a dissociated state, and corresponds to the bond energy of the atoms of a polymer.

The laser diode chip 111 has a double heterostructure (DH structure) in which, for example, an n-type clad layer 113 formed of aluminum-gallium-arsenide (AlGaAs), an active layer 114 formed of gallium-arsenide (GaAs), a p-type clad layer 115, and a p-type cap layer 116 are consecutively laminated on an n-type GaAs substrate 112. An electrode 117 is selectively formed on the obverse surface of the laser diode chip in an opening of the p-type cap layer 116, and a rear electrode 8 is formed on the reverse surface of the GaAs substrate 112.

Figure 2A:
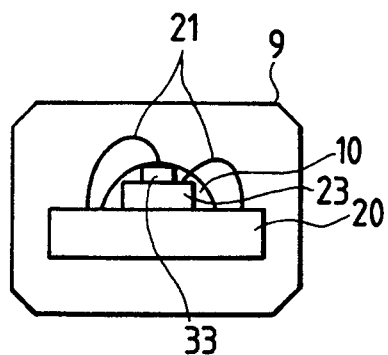
FIG. 2(a) is a schematic front view of the laser diode in accordance with the first embodiment of the invention.
Figure 2B:
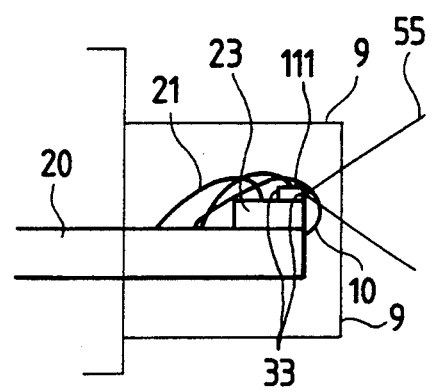
FIG. 2(b) is a schematic side view of the laser diode shown in FIG. 2(a)
Figure 2C:
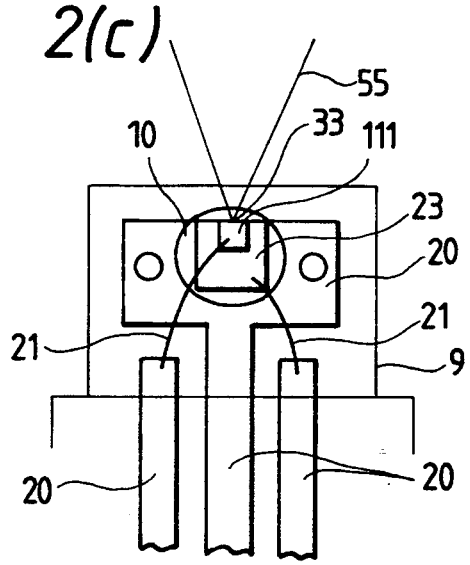
FIG. 2(c) is a plan view of the laser diode shown in FIG. 2(a)

Referring to FIGS. 2(a), 2(b) and 2(c), which are front, side and plan views of the laser diode of the first embodiment, respectively, the laser diode chip 111 is secured to a distal end of a central one of three lead frames 20 via a silicon submount layer 23. A bonding wire, such as a gold wire 21, is wired from the silicon submount layer 23 and the p-type cap layer 116 to each lead frame 20. The laser diode chip 111 is encapsulated with an encapsulating resin 9, such as a transparent epoxy resin or the like.

The end-face-breakage preventing layer 10 is constituted by a silicon-based resin constituted by dimethylpolysiloxane ($\{(CH_3)_2\text{—}Si\text{—}O\}_n$), and is formed to a 5 μm thickness by coating the light-emitting end face 33 with dimethylpolysiloxane, and subjecting the coating to cure treatment at 150° C. for four hours, for example. The process of coating the light-emitting end face 33 with dimethylpolysiloxane occurs when the laser diode chip 111 is a single piece or is mounted on the lead frame 20. The bond energy of Si—O—Si of dimethylpolysiloxane is approximately 108 kcal/mol, and is sufficiently high as compared with normal epoxy resin. The bond energy Si—O—Si of dimetheylpolysiloxane does not have an absorption band in the vicinity of the 780 nm oscillation wavelength of the GaAs laser diode.

Figure 3:
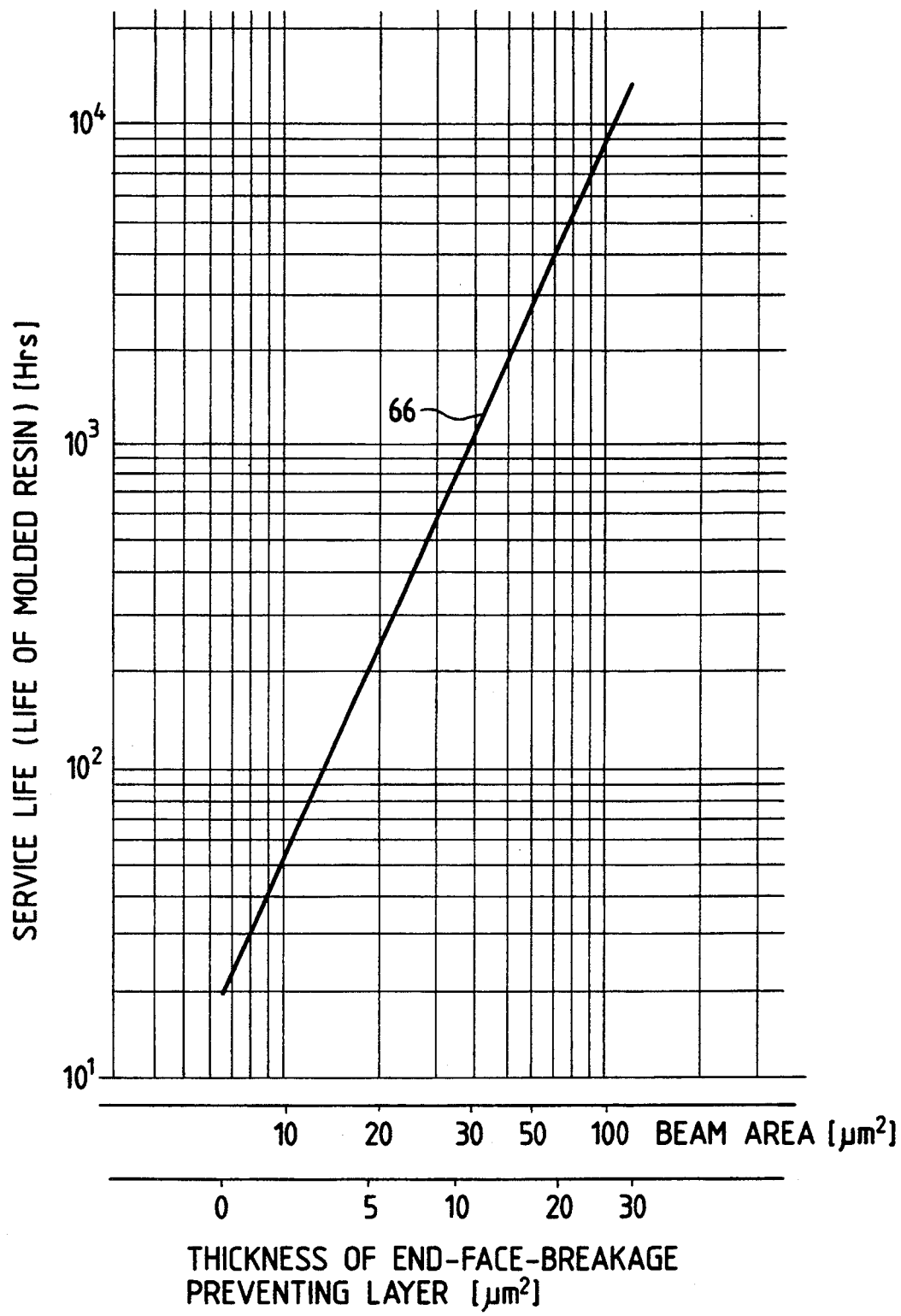
FIG. 3 is a graph illustrating the relationship between the service life of the laser diode of the first embodiment of the invention, and the thickness of the end-face-breakage preventing layer and the beam area of the laser beam.

FIG. 3 shows the relationship between the service life of the laser diode and the thickness of the end-face breakage preventing layer 10 in a case where a GaAs laser diode with a maximum rating of 5 mW is continuously used at an operating current of about 55 mA at an ambient temperature of about 60° C. The service life denotes the time up until the encapsulating resin layer 116 (mold resin layer) is damaged, and variations occur in the laser output.

Figure 4:
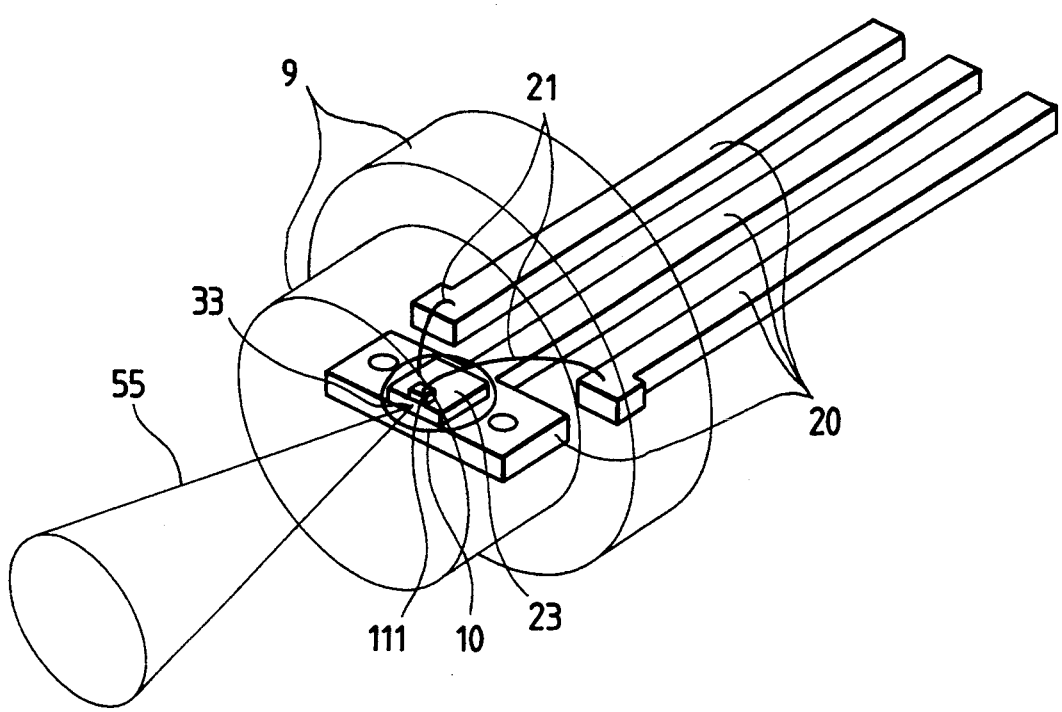
FIG. 4 is a perspective view of the laser diode in accordance with the first embodiment of the invention.

In FIG. 3, the abscissa indicates the thickness of the dimethylpolysiloxane layer, i.e., the end-face-breakage preventing layer 10, as well as the beam area of a laser beam corresponding to the thickness. The ordinate indicates the service life of the laser diode. The laser beam is emitted in such a manner that the beam area expands in the direction of emergence, as shown by 55 in FIGS. 2(b), 2(c), and 4. The beam area in FIG. 3 is the beam area defined at a boundary between the end-face-breakage preventing layer 10 and the encapsulating resin layer 9.

As shown by a solid line 66 in FIG. 3, the service life of the laser diode is prolonged with an increase in the thickness of the end-face-breakage preventing layer 10. For example, the service life is 50 hours or less if the end-face-breakage preventing layer 10 is not provided. If the thickness of the end-face-breakage preventing layer 10 is set to approximately 5 μm, the service life is improved to about 150 hours or more. If the thickness of the end-face-breakage preventing layer 10 is further increased and set to approximately 20 to 30 μm, the service life falls within the range of approximately 3,800 to 12,000 hours. As a result, the service life is improved such that the laser diode can be reliably used for a pickup an optical recording medium.

In the laser diode of this first embodiment of the invention, encapsulating layer 9, such as epoxy resin, does not abut against the light-emitting end face 33. Instead, the end-face-breakage preventing layer 10, having a low coefficient of light absorption in the wavelength band of a laser beam and being constituted by a heat-resistant, silicon-based resin layer, abuts against the light-emitting end face 33. The end-face-breakage preventing layer 10 is formed at the portion where thermal stress is highest, and the amount of heat generated due to the absorption of the laser beam at the boundary is small. Accordingly, since the encapsulating resin layer 9 does not directly receive heat transmitted from the light-emitting end face 33, and does not undergo heat generation due to the absorption of the laser beam, decomposition or the like does not occur in the vicinity of the light-emitting end face 33. Hence, it is possible to attain stabilization of light emission characteristics of the laser diode, improved reliability, and prolonged service life.

As plotted by the solid line 66 in FIG. 3, the relationship between the service life and the thickness of the end-face-breakage preventing layer 10 can be viewed in terms of the relationship between the service life and the beam area. In addition to directly protecting the encapsulating resin layer 9 from heat, the effect of the end-face-breakage preventing layer 10 on the encapsulating resin layer 9 is related to the action of dispersing the energy of the laser beam inside the encapsulating resin 9 and forming a lower energy density. More particularly, as the laser beam passes through the end-face-breakage preventing layer 10, the beam area of the laser beam is expanded inside the end-face-breakage preventing layer 10, and the laser beam passes through the encapsulating resin layer 9 in an expanded state. Consequently, since the laser beam passes through the encapsulating resin layer 9 in a state in which its energy density is low, damage to the encapsulating resin layer 9 is less likely to occur. For this reason, by specifying a predetermined thickness of the end-face-breakage preventing layer 10, it is possible to alleviate the stress to which the transparent mold resin layer is subjected, and to prolong the service life of the laser diode. Assuming the laser diode is to be used as a pickup for an optical recording medium, the thickness of the end-face-breakage preventing layer 10 can be set to approximately 20 to 30 μm, for a targeted service life of about 3,500 hours or more.

It should be noted that although a silicon-based resin constituted by dimethylpolysiloxane is used as the end-face-breakage preventing layer 10 using an organic resin material, the present invention is not restricted to the same, and other silicon-based resins or acrylic resins, such as polymethyl methacrylate resin, may be used.

SECOND EMBODIMENT

A description will now be given of a second embodiment of the present invention in which an inorganic material is used for the end-face-breakage preventing layer.

Figure 5:
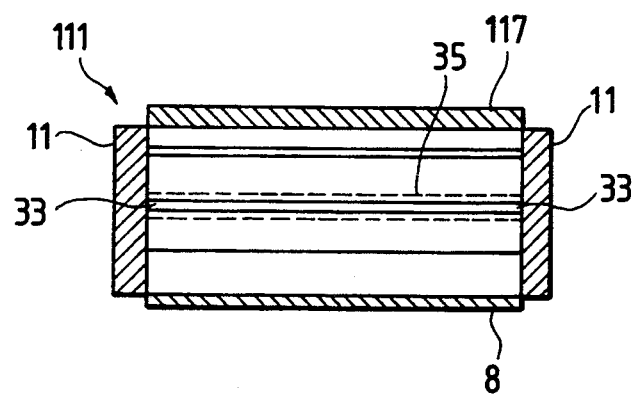
FIG. 5 is a cross-sectional view illustrating a laser diode in accordance with a second embodiment of the invention in which an inorganic layer is formed on a light-emitting end face of the laser diode chip.
Figure 6:
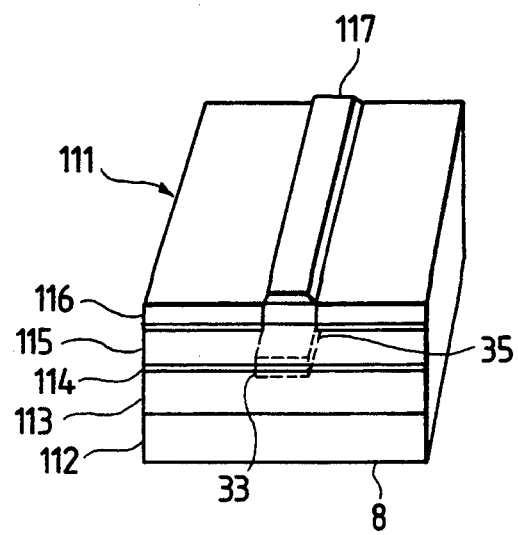
FIG. 6 is a perspective view illustrating a configuration of a conventional laser diode chip.
Figure 7:
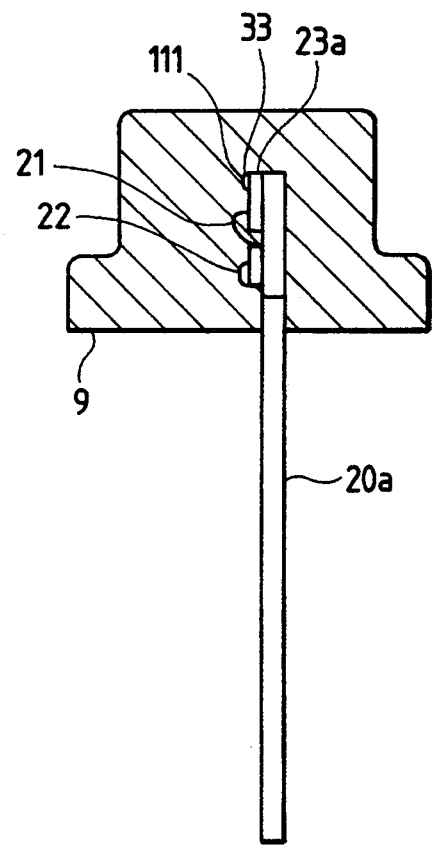
FIG. 7 is a cross-sectional view illustrating a configuration of a conventional laser diode.

FIG. 5 is a cross-sectional view of a laser diode chip 111 used in a laser diode in accordance with the second embodiment of the present invention. The cross-sectional view illustrates a state in which an end-face-breakage preventing layer 10 formed of an inorganic material is coated on the light-emitting end face 33 of the laser diode chip 111 having a DH structure. The laser diode of this embodiment has a configuration similar to that of the laser diode of the first embodiment. Thus, con, non components and portions will be denoted by the same reference numerals, and a description thereof will be omitted.

In FIG. 5, an inorganic layer 11 serving as the end-face-breakage preventing layer is formed by a process in which powders of a low-melting glass with $Al_2O_3$ and $SiO_2$, Pb and Zn, or the like added thereto, are dispersed in a solvent to form a slurry. After this material is applied to the light-emitting end face 33, the material is heated to approximately 450° C.

The inorganic layer 11 is substantially transparent with respect to the 780 nm wavelength of the laser beam. Since its heat resistance is sufficiently high, the inorganic layer 11 is capable of attaining stabilization of the light emission characteristics of the laser diode and a prolonged service life without being damaged by the laser beam, as in the case of the end-face-breakage preventing layer 10 using the organic resin (dimethylpolysiloxane). Furthermore, if the thickness of the inorganic layer 11 is set to approximately 20 to 30 μm, in addition to exerting a direct heat-resistant action, the inorganic layer 11 allows the laser beam to pass through the interior of the encapsulating resin layer with the beam diameter expanded. Thus, the life of the laser diode is prolonged in the same way as in the first embodiment.

As described above, in both laser diodes of the first and second embodiments, the encapsulating resin layer is protected from the laser beam by the formation of an end-face-breakage preventing layer to suppress the deterioration and decomposition of the encapsulating resin layer. As a result, it is possible to attain stabilization of the light emission characteristics of the laser diode and a prolonged laser diode service life. It is to be understood that the configuration of each laser diode chip and the materials of component parts, the configuration of the laser diode itself, and the like should not be restricted to the foregoing embodiments, and should be set to optimum conditions in correspondence with a required laser beam output, usage, and the like.

As described above, the present invention is characterized in that, in a laser diode formed by encapsulating a laser diode chip with a resin, a highly heat-resistant end-face-breakage preventing layer having a low coefficient of absorption with respect to the wavelength of a laser beam is provided on a light-emitting end face of the chip. In accordance with the present invention, the properties of the end-face-breakage preventing layer do not change by heat generation and the like attributable to heat conduction based on the generation of heat in the chip and the absorption of the laser beam. Since the end-face-breakage preventing layer is present on the light-emitting end face, the encapsulating resin layer is protected and its decomposition and the like are prevented. Accordingly, the laser diode in accordance with the present invention has both an improved reliability and a prolonged service life that are attained through the stabilization of the light emission characteristics of the laser diode.

In particular, in a case where the thickness of the end-face-breakage preventing layer is set in the range of approximately 20 to 30 μm, the beam area of the laser beam is expanded in the end-face-breakage preventing layer, and the laser beam passes through the encapsulating resin layer in a state in which its energy density is small. Hence, the stress occurring in the encapsulating resin layer is alleviated, and it is therefore possible to realize a laser diode with a long service life that may be used for a pickup for an optical recording medium.

The foregoing description of preferred embodiments of the invention has been presented for purposes of illustration and description. It is not intended to be exhaustive or to limit the invention to the precise form disclosed, and modifications and variations are possible in light of the above teachings or may be acquired from practice of the invention. The embodiments were chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and there equivalents.

What is claimed is:

1. A laser diode device comprising:
   a laser diode chip encapsulated with a resin, the laser diode chip having at least one light-emitting end face; and
   an end-face-breakage preventing layer made of an organic resin and disposed on the light-emitting end face, the end-face-breakage preventing layer having a thickness of at least 5 μm, and the organic resin having a low coefficient of light absorption in a wavelength operation region of the laser diode and a dissociation energy of at least 90 kcal/mol, the dissociation energy of the organic resin being greater than a dissociation energy of the encapsulating resin.

2. A laser diode device according to claim 1, wherein the end-face-breakage preventing layer is made of an organic resin selected from a silicon-based resin and an acrylic resin.

3. A laser diode device according to claim 2, wherein the silicon-based resin has dimethylpolysiloxane as its principal component.

4. A laser diode device according to claim 2, wherein the acrylic resin is polymethyl methacrylate resin.

5. A laser diode device according to claim 1, wherein the thickness of the end-face-breakage preventing layer is in the range of approximately 20 to 30 μm.

6. A laser diode device according to claim 2, wherein the thickness of the end-face-breakage preventing layer is in the range of approximately 20 to 30 μm.

7. A laser diode device according to claim 3, wherein the thickness of the end-face-breakage preventing layer is in the range of approximately 20 to 30 μm.

8. A laser diode device according to claim 4, wherein the thickness of the end-face-breakage preventing layer is in the range of approximately 20 to 30 μm.

9. A laser diode device comprising:
   a laser diode chip having at least one light-emitting end face;
   a resin encapsulating the laser diode chip; and
   an end-face-breakage preventing layer disposed between the light-emitting end face and the encapsulating resin, the end-face-breakage preventing layer having a thickness of at least 5 μm and being made of inorganic materials having a low coefficient of light absorption in a wavelength operating region of the laser diode.

10. A laser diode device according to claim 9, wherein a principal component of the end-face-breakage preventing layer is an oxide selected from aluminum oxide and a silicon oxide.

11. A laser diode device according to claim 9, wherein a principal component of the end-face-breakage preventing layer is a low-melting glass.

12. A laser diode device according to claim 9, wherein the thickness of the end-face-breakage preventing layer is in the range of approximately 20 to 30 μm.

13. A laser diode device according to claim 10, wherein the thickness of the end-face-breakage preventing layer is in the range of approximately 20 to 30 μm.

14. A laser diode device according to claim 11, wherein the thickness of the end-face-breakage preventing layer is in the range of approximately 20 to 30 μm.

15. A laser diode device comprising:
   a laser diode chip having at least one light-emitting end face;
   a resin encapsulating the laser diode chip; and
   an end-face-breakage preventing layer disposed between the light-emitting end face and the encapsulating resin, the end-face-breakage preventing layer having a thickness of at least 5 μm and having a low coefficient of light absorption in a wavelength operating region of the laser diode.

* * * * *